(12) United States Patent
Zhang et al.

(10) Patent No.: US 8,614,894 B2
(45) Date of Patent: Dec. 24, 2013

(54) ELECTRONIC DEVICE ASSEMBLY HAVING PROTECTING MECHANISM

(75) Inventors: Guang-Yi Zhang, Shenzhen (CN); Tie-Shan Jiang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 329 days.

(21) Appl. No.: 13/220,632

(22) Filed: Aug. 29, 2011

(65) Prior Publication Data
US 2012/0320533 A1  Dec. 20, 2012

(30) Foreign Application Priority Data
Jun. 15, 2011 (CN) .......................... 2011 1 0159786

(51) Int. Cl.
*H05K 7/16* (2006.01)

(52) U.S. Cl.
USPC ........... 361/726; 361/727; 361/728; 361/730; 361/732; 312/223.3; 312/223.1; 312/333; 312/332.1; 312/319.1

(58) Field of Classification Search
USPC ......... 361/725, 726, 727, 728, 730, 732, 740, 361/741; 312/223.3, 223.1, 333, 332.1, 312/319.1, 223.2; 70/78–84; 211/26.2, 192
See application file for complete search history.

(56) References Cited

U.S. PATENT DOCUMENTS 7,643,306 B2 * 1/2010 Karstens ...................... 361/754

* cited by examiner

*Primary Examiner* — Robert J Hoffberg
*Assistant Examiner* — Hung Dang
(74) *Attorney, Agent, or Firm* — Altis Law Group, Inc.

(57) ABSTRACT

An exemplary electronic device assembly includes a cabinet and electronic devices received in the cabinet. The cabinet includes four columns substantially positioned at four corners of the cabinet. A window is defined between two front columns. Each electronic device includes a casing, which includes a bottom plate, a lateral side and an actuator. The bottom plate defines an inserting opening therein. The lateral side defines an engaging opening therein. The actuator movably connects to the casing and includes an engaging portion and an abutting portion. The abutting portion extends through the inserting opening. The engaging portion extends through the engaging opening and engages with one of the columns. When the abutting portion is pushed up, the actuator moves and the engaging portion disengages from the column.

12 Claims, 10 Drawing Sheets

ELECTRONIC DEVICE ASSEMBLY HAVING PROTECTING MECHANISM

BACKGROUND

1. Technical Field

The present disclosure relates to an electronic device assembly having a safety mechanism for protecting stacked electronic devices inside a cabinet of the electronic device assembly when the electronic devices are withdrawn from the cabinet.

2. Description of Related Art

Composite electronic devices such as server assemblies include a cabinet, and a plurality of servers received in the cabinet and arranged in a stack. There are two major kinds of server assemblies: server assemblies with rails, and server assemblies without rails. Both kinds of server assemblies have a similar outer appearance. Often, the only significant difference is that the non-rail type server assembly has no rails inside the cabinet.

When the servers in the cabinet of the rail-type server assembly need to be repaired or replaced, the servers can be pulled outside of the cabinet along the rails of the cabinet.

Since the non-rail type server assembly has no rails in the cabinet, the cabinet has a relatively simple structure, which is well appreciated by users. When a server in the cabinet of the non-rail type server assembly needs to be pulled outside of the cabinet, the server is slid out along an adjacent server which is beneath the server being removed. However, occasionally the server being removed has no adjacent server underneath. If the user taking out the server mistakenly believes that the server assembly is a rail-type server assembly, the user may drop the server down inside the cabinet when the user begins to remove the server. Thus there is a risk of causing damage to the server being removed, other servers and elements in the cabinet, and the cabinet itself. The user's own safety may also be imperiled.

What is needed, therefore, is an electronic device assembly which can overcome the above-mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views, and all the views are schematic.

DETAILED DESCRIPTION

Figure 1:
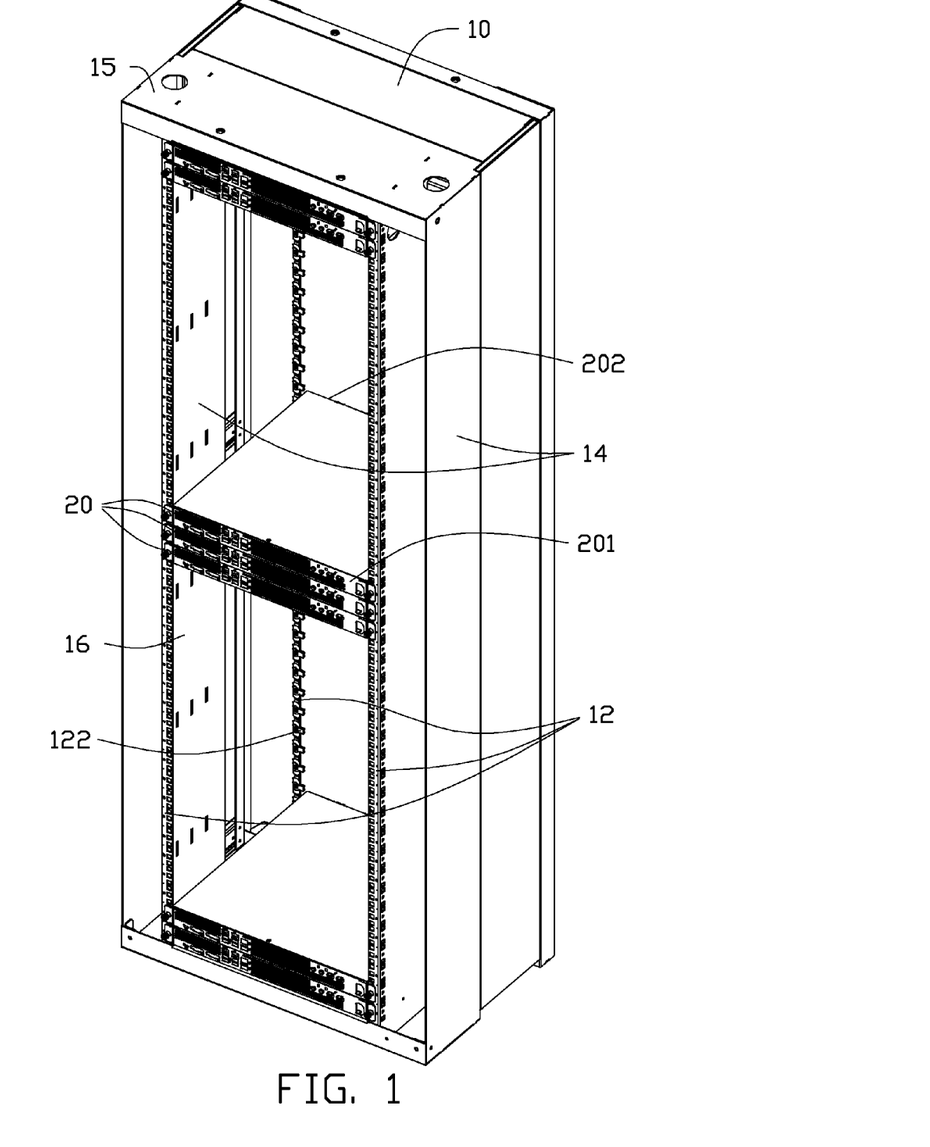
FIG. 1 is an isometric view of an electronic device assembly in accordance with an embodiment of the present disclosure, the electronic device assembly including a plurality of stacked electronic devices.
Figure 7:
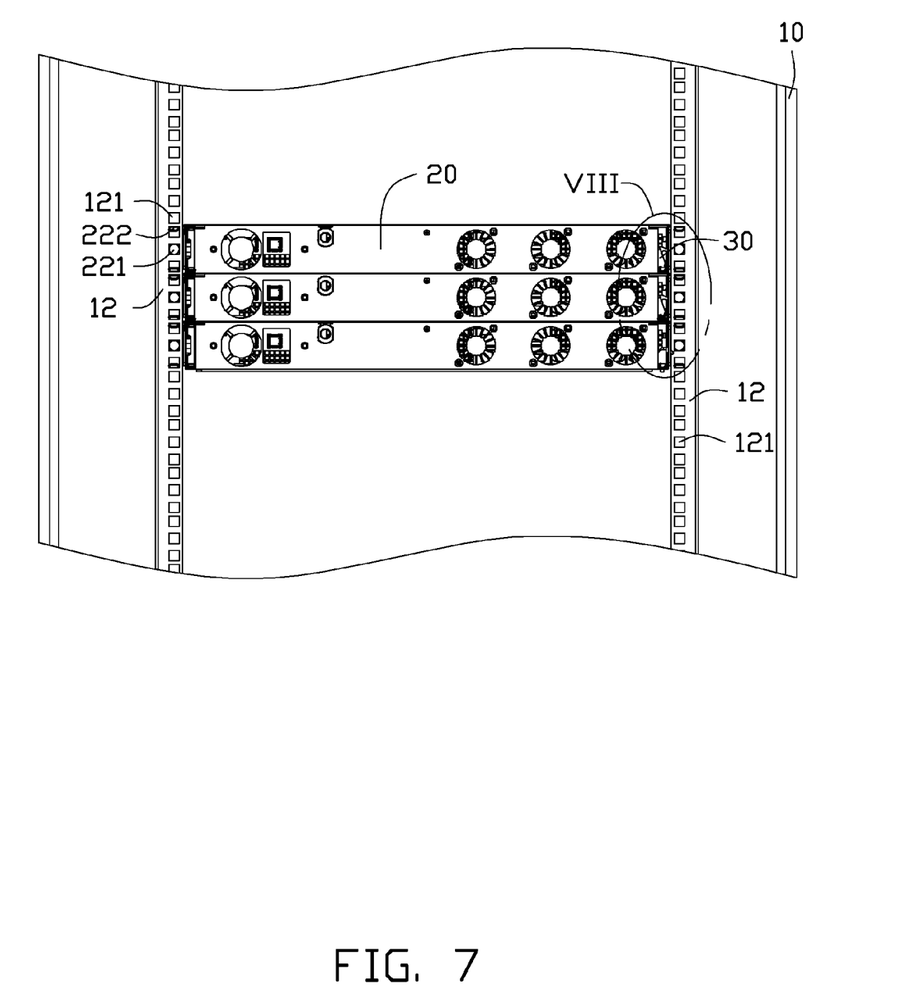
FIG. 7 is an enlarged, rear plan view of part of the electronic device assembly of FIG. 1, wherein a back side of the casing is omitted for clarity.
Figure 8:
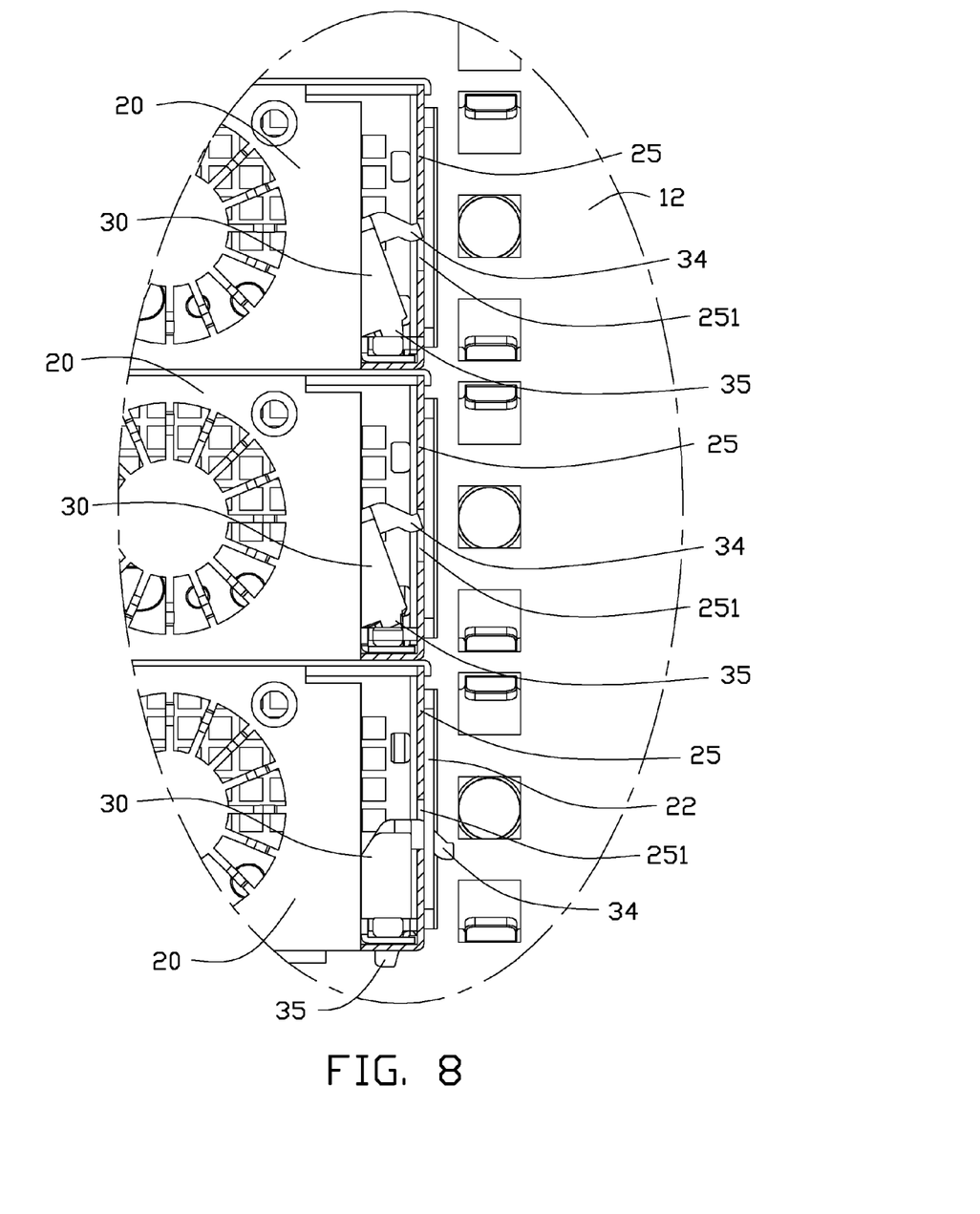
FIG. 8 is an enlarged view of an ellipse-shaped part VIII of FIG. 7.

Referring to FIGS. 1, 7 and 8, an electronic device assembly in accordance with an embodiment of the present disclosure is a server assembly. In particular, the server assembly is a non-rail type server assembly. It is noted that the electronic device assembly can also have other alternative applications. For example, the electronic device assembly can instead be a storage device assembly.

The electronic device assembly comprises a cabinet 10, and one or more electronic devices received in the cabinet 10. In the present embodiment, the electronic devices are servers such as blade servers. In alternative embodiments, the electronic devices can for example be storage devices. Each server has a casing 20. The casings 20 are arranged one above the other, and adjacent casings 20 are stacked together. Front and rear ends of the casings 20 are secured onto the cabinet 10. An actuator 30 is accommodated in each of the casings 20. When any one casing 20 does not have another casing 20 located immediately beneath, such casing 20 is referred to herein as being "suspended." When a casing 20 is suspended, the actuator 30 is engaged with the cabinet 10 to prevent that the casing 20 from being pulled out from the cabinet 10.

The electronic device assembly will be described in more detail with reference to other drawings too. Referring to FIG. 1 again, the cabinet 10 comprises four columns 12 positioned at substantially four corners thereof, respectively. A plurality of front, back and lateral side plates 14 and a top plate 15 are coupled to the columns 12 to form a substantially enclosing housing for receiving the casings 20. A window 16 is defined between two front columns 12, for the casings 20 to be inserted into and withdrawn from the cabinet 10.

In FIG. 1, seven casings 20 are shown assembled in the cabinet 10. It is understood that the number of the casings 20 assembled in the cabinet 10 depends on a desired requirement. For example, there can be only one casing 20 assembled in the cabinet 10, or there can be multiple casings 20 fully filling the cabinet 10. A front end 201 of each casing 20 is secured onto the front columns 12. A rear end 202 of each casing 20 is secured onto two rear columns 12.

Figure 2:
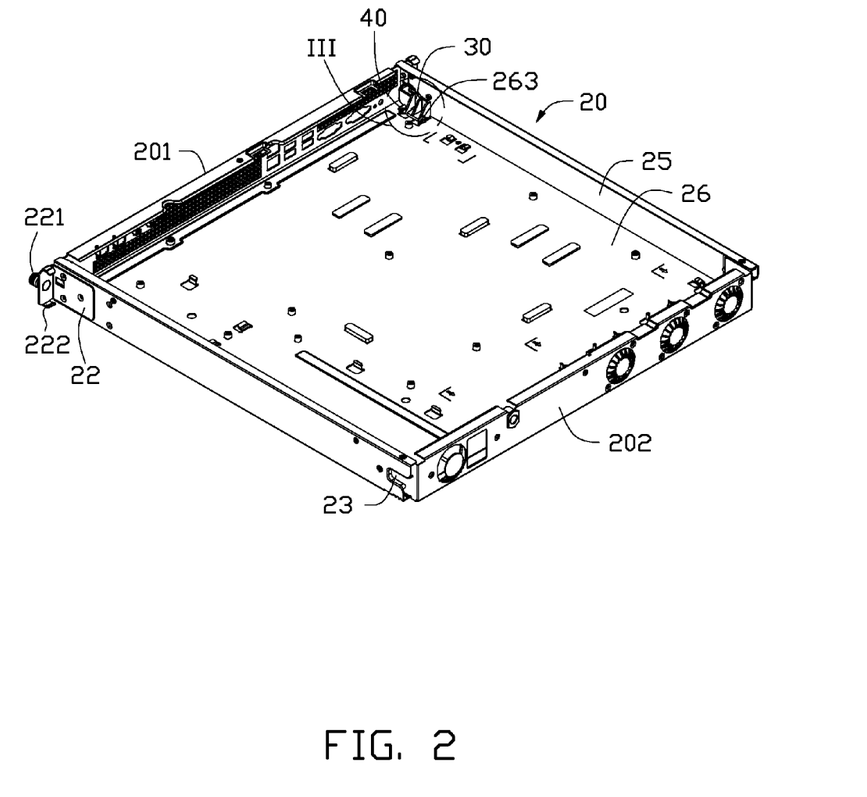
FIG. 2 is an isometric, enlarged view of a casing of one of the electronic devices of FIG. 1.
Figure 3:
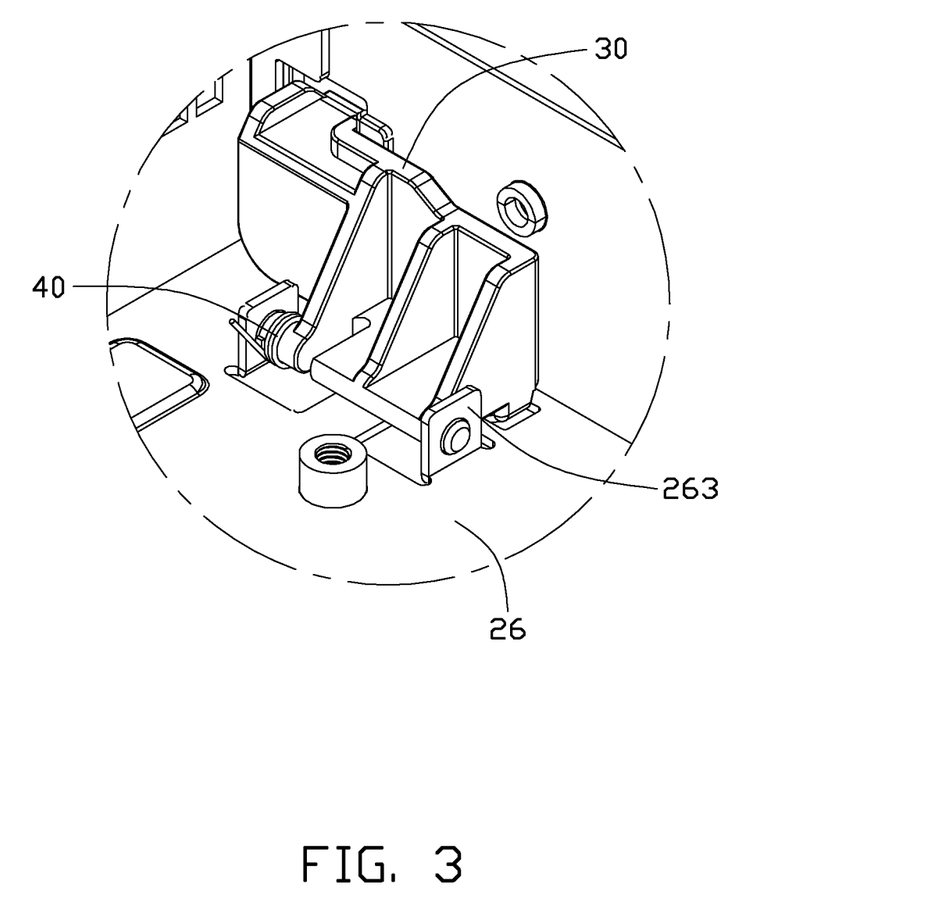
FIG. 3 is an enlarged view of a circled part III of FIG. 2.

Also referring to FIGS. 2-4 and 7-8, each casing 20 has a substantially rectangular box shape. In FIGS. 2 and 3, a top cover of the casing 20 is omitted, for clarity. Understandably, the casing 20 can alternatively have no top cover. Two L-shaped securing plates 22 are formed on the front end 201 of the casing 20. The securing plates 22 are connected to the front columns 12, respectively, to secure the front end 201 of the casing 20 onto the front columns 12. Two securing mortises 23 are defined in the rear end 202 of the casing 20. A plurality of tenons 122 is formed on the rear columns 12. The securing mortises 23 engagingly receive two corresponding tenons 122, whereby the rear end 202 of the casing 20 is secured onto the rear columns 12. Specifically, the securing plates 22 are positioned on two lateral sides of the front end 201 of the casing 20. Each securing plate 22 comprises two claws 222. A plurality of securing holes 121 is defined in the front columns 12. The claws 222 are inserted into two corresponding securing holes 121 of the respective front column 12, and are locked on the front column 12 by a screw 221. It is noted that, in alternative embodiments, the casing 20 can be secured onto the columns 12 by any of various other mechanisms known in the art.

Figure 4:
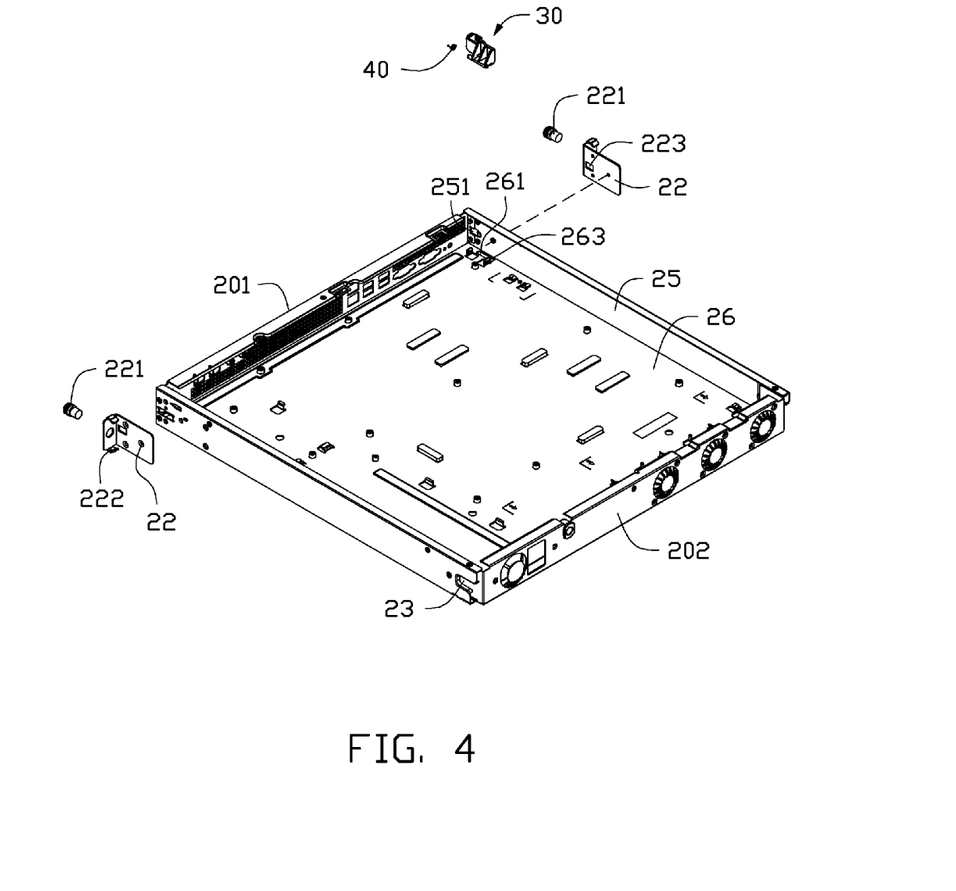
FIG. 4 is an exploded view of the casing of FIG. 2.

An engaging opening 251 is defined in a lateral side of the casing 20, for example, a left lateral side 25 of the casing 20. The engaging opening 251 is near the front end 201 and far away from the rear end 202 of the casing 20. The engaging opening 251 is configured for allowing a part of a corresponding actuator 30 to extend through and engage in a respective one of a plurality of vertical grooves (not labeled) of the corresponding front column 12 of the cabinet 10 (which is described in more detail hereinafter). Since one of the securing plates 22 is positioned at the location where the engaging opening 251 is defined, a through hole 223 is also defined in the securing plate 22 for the part of the actuator 30 to extend through.

An inserting opening 261 is defined in a bottom plate 26 of the casing 20 for another part of the actuator 30 to extend through (which is described in more detail hereinafter). Two securing tabs 263 are formed on the bottom plate 26. A pivoting hole (not labeled) is defined in each of the securing tabs 263, for the actuator 30 to be pivotally connected to the securing tabs 263.

Figure 5:
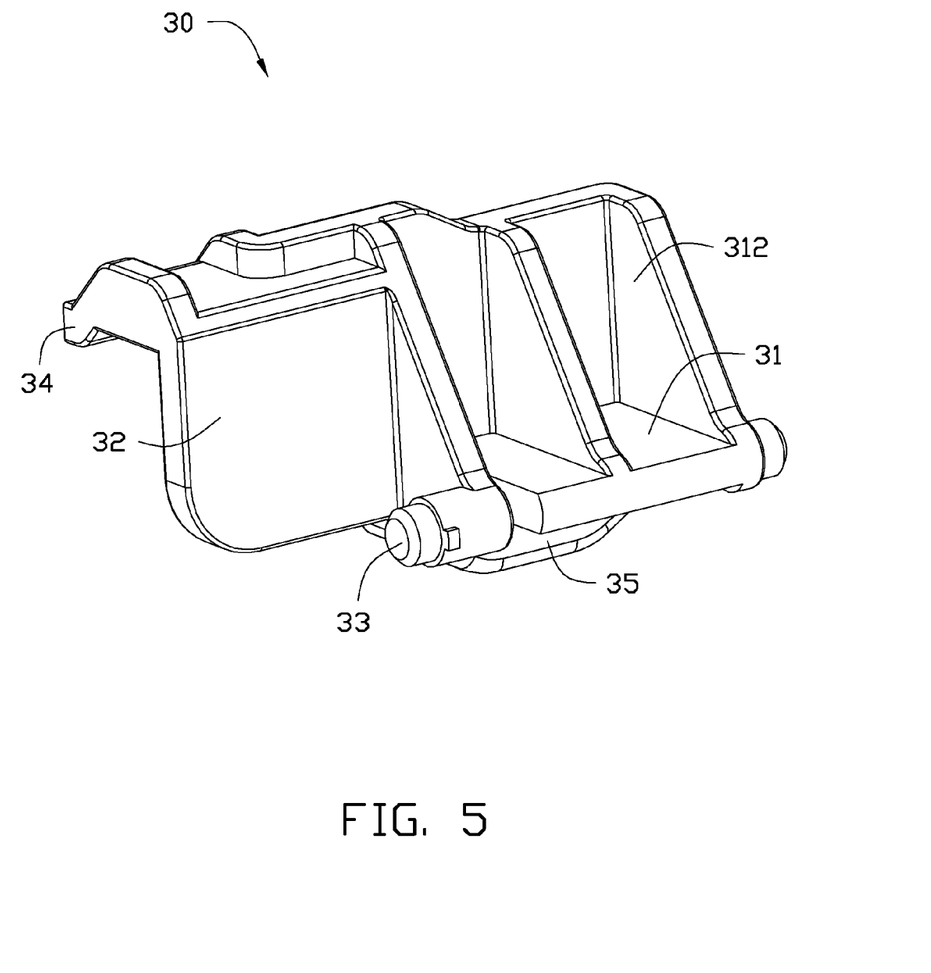
FIGS. 5 and 6 are enlarged, isometric views of an actuator of the casing of FIG. 2, shown from different aspects.
Figure 6:
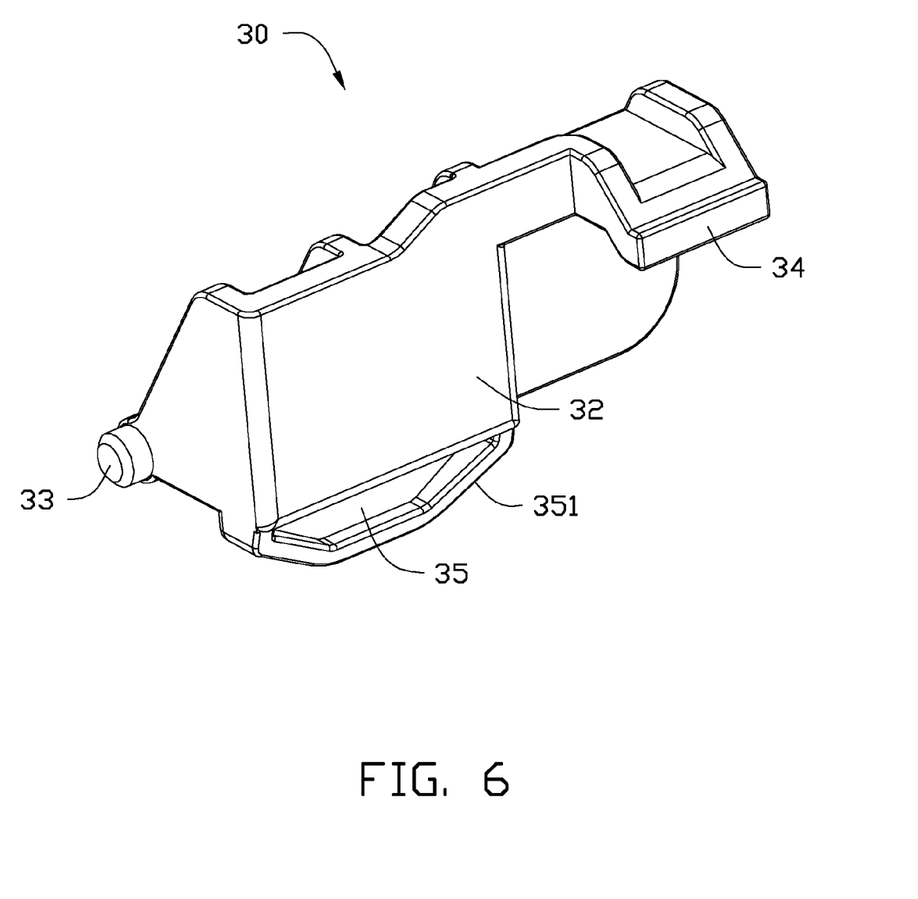

Referring to FIGS. 5 and 6, each actuator 30 comprises a horizontal plate 31 and a vertical plate 32 extending upwardly from a lateral side of the horizontal plate 31. A pair of pivot pins 33 is formed on an opposite lateral side of the horizontal plate 31. The pivot pins 33 are aligned with each other, along a common axis of rotation of the actuator 30. An elastic element 40 such as a spring (shown in FIGS. 2-4) is mounted on one of the pivot pins 33. The actuator 30 is thus able to be pivotally connected to the securing tabs 263 of the bottom plate 26 of a corresponding casing 20, and be elastically biased in such position. An abutting portion 35 extends downwardly from a bottom surface of the horizontal plate 31. The abutting portion 35 is capable of extending through the inserting opening 261 of the bottom plate 26 of the casing 20. An engaging portion 34 extends horizontally and outwardly from the vertical plate 32. Specifically, the engaging portion 34 extends from a top end of the vertical plate 32. The engaging portion 34 is capable of extending through the engaging opening 251 of the left lateral side 25 of the casing 20. A plurality of ribs 312 is formed between the horizontal plate 31 and the vertical plate 32, for increasing a strength of the actuator 30.

The actuator 30 is elastically biased by the elastic element 40 to rotate about the securing tabs 263 of the bottom plate 26 of the corresponding casing 20. Resilience provided by the elastic element 40 causes the abutting portion 35 of the actuator 30 to extend through the inserting hole 261 of the bottom plate 26 and be exposed outside of the casing 20, and the engaging portion 34 of the actuator 30 to extend through the engaging opening 251 of the left lateral side 25 of the casing 20 and the through hole 223 of the securing plate 22 to be exposed outside of the casing 20. When a force is exerted upwardly on the abutting portion 35 of the actuator 30, the actuator 30 can rotate about the bottom plate 26 of the casing 20 (i.e., rotate about the pivot pins 33). When this happens, the abutting portion 35 moves toward the inside of the casing 20 so that it no longer protrudes out from the inserting opening 261, and the engaging portion 34 moves toward the inside of the casing 20 so that it no longer protrudes out from the engaging opening 251 of the casing 20.

As shown in FIGS. 7 and 8, due to pushing by a lower one of two adjacent casings 20, the abutting portion 35 of the actuator 30 of an upper one of the two adjacent casings 20 is urged to move inside the upper casing 20, and the actuator 30 is correspondingly rotated. Accordingly, the engaging portion 34 of the actuator 30 is moved inside the upper casing 20 and is disengaged from the front column 12 positioned outside the casing 20. After releasing the screws 221, the upper casing 20 can be pulled outside of the cabinet 10 along the lower casing 20.

When there is no other casing 20 positioned beneath a given casing 20, the casing 20 is suspended. The abutting portion 35 of the actuator 30 in the casing 20 extends through the inserting hole 261 of the bottom plate 26, and the engaging portion 34 of the actuator 30 extends through the engaging hole 251 of the left lateral side 25 of the casing 20 and is engaged with the corresponding front column 12 positioned outside the casing 20, due to the resilience of the elastic element 40. Therefore after releasing the screws 221, the abutting portion 35 can be manually pushed upwardly to disengage the engaging portion 34 from the front column 12, and the casing 20 can be pulled out from the cabinet 10. The actuator 30 provided in the casing 20 keeps the casing 20 in position even after the screws 221 have been released, and thus prompts the user to check the status of the casing 20. That is, the user is reminded of the need to release the actuator 30, which helps assure that the user properly carries out the operation of pulling the casing 20 out from the cabinet 10. Thus, the risk of the user dropping the casing 20 and damaging various elements in the cabinet 10 is minimized. This is also good for the user's own safety.

For facilitating assembly of another casing 20 beneath a suspended casing 20, a guiding surface 351 is formed on the abutting portion 35, with the guiding surface 351 facing the window 16 of the cabinet 10. The guiding surface 351 can be a curved surface, a sloped surface, etc.

In an alternative embodiment, two actuators 30 can be used for each casing 20. The actuators 30 are assembled both at the left lateral side 25 and a right lateral side of the casing 20, whereby engagement of the actuators 30 and the front columns 12 can be accomplished.

In another alternative embodiment, the actuator 30 can instead be assembled adjacent to the rear end 202 of the casing 20, so that the actuator 30 engages in a respective one of a plurality of vertical grooves (not shown) defined in one of the rear columns 12 of the cabinet 10.

Figure 9:
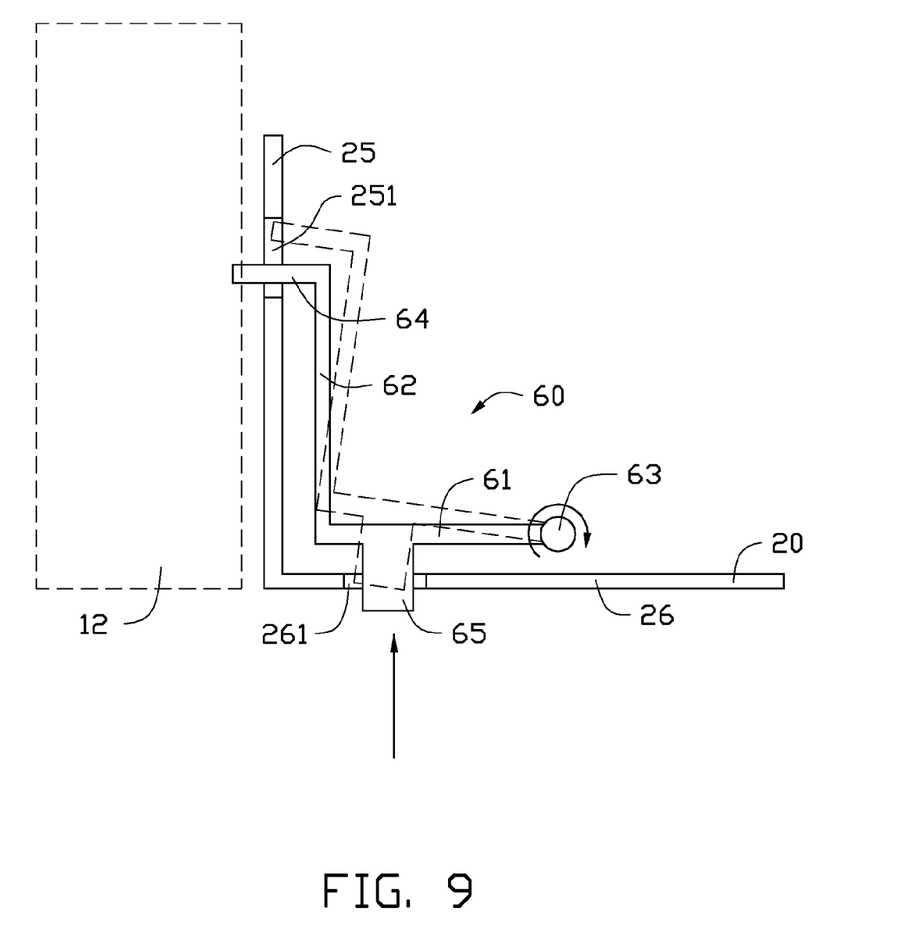
FIGS. 9 and 10 essentially show structures and principles of actuators of electronic device assemblies in accordance with other embodiments of the present disclosure.

In addition, the structure of the actuator 30 is not limited to the embodiments described above. Referring to FIG. 9, an actuator 60 of an electronic device assembly in accordance with another embodiment comprises a horizontal plate 61, a vertical plate 62 extending upwardly from a lateral side of the horizontal plate 61, and a pair of pivot pins 63 formed at an opposite lateral side of the horizontal plate 61. The actuator 60 is elastically biased by an elastic element (not shown) to rotate about the bottom plate 26 of a casing 20. An engaging opening 251 is defined in a lateral side 25 of the casing 20, for an engaging portion 64 of the actuator 60 to extend through. An inserting opening 261 is defined in a bottom plate 26 of the casing 20, for an abutting portion 65 of the actuator 60 to extend through. Resilience provided by the elastic element can urge the engaging portion 64 to extend through the engaging opening 251 of the lateral side 25 of the casing 20 and engage with a corresponding column 12 positioned outside the casing 20. When an upward force (as shown by an arrow) is exerted on the abutting portion 65 of the actuator 60, the abutting portion 65 moves toward the inside of the casing 20 and no longer protrudes from the inserting opening 261, the actuator 60 rotates relative to the bottom plate 26 of the casing 20, and the engaging portion 64 moves toward the inside of the casing 20 and disengages from the column 12, as shown by the dashed lines.

Figure 10:
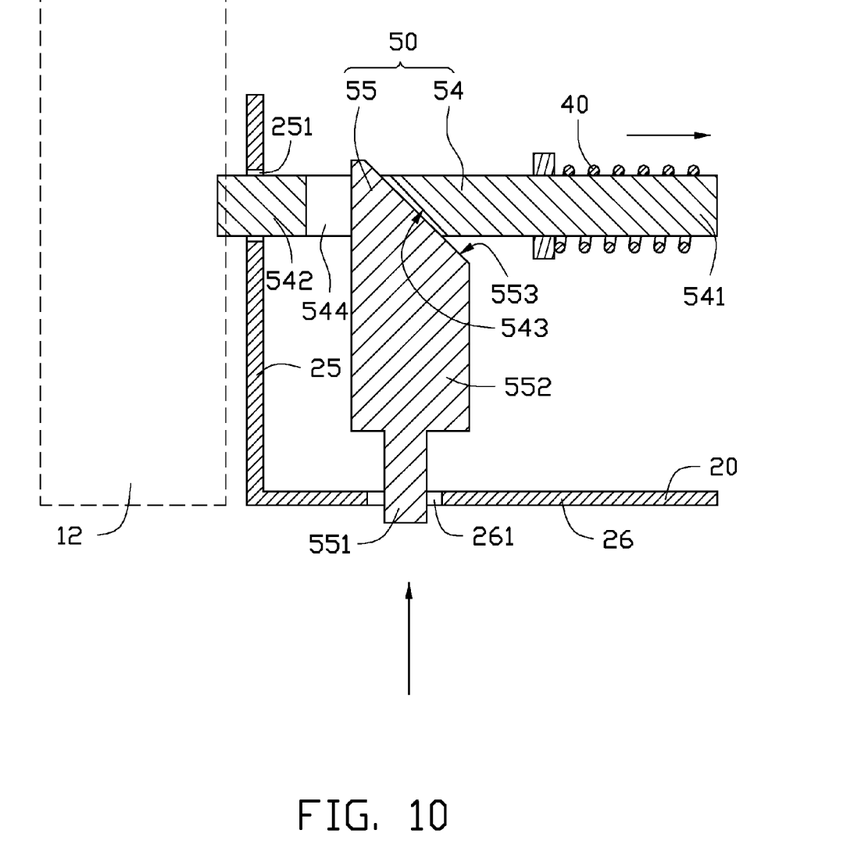

FIG. 10 shows an actuator 50 of an electronic device in accordance with still another embodiment. The actuator 50 comprises an engaging portion 54 and an abutting portion 55.

A first end 541 of the engaging portion 54 is elastically connected to a casing 20 via an elastic element 40. A second end 542 of the engaging portion 54 opposite to the first end 541 is capable of extending through an engaging opening 251 defined in a lateral side 25 of the casing 20 and engaging with a corresponding column 12 positioned outside the casing 20. A slot 544 is defined in the engaging portion 54. An inner edge of the engaging portion 54 at the slot 544 is defined as a transitioning surface 543.

The abutting portion 55 is separate from the engaging portion 54. A bottom end 551 of the abutting portion 55 extends through an inserting opening 261 defined in a bottom plate 26 of the casing 20. The diameter of a main body 552 of the abutting portion 55 is larger than that of the inserting opening 261, so that the main body 552 cannot escape out from the casing 20 via the inserting opening 261. The abutting portion 55 is thus substantially positioned on the bottom plate 26, with only a bottommost part of the bottom end 551 protruding out below the bottom plate 26. An abutting surface 553 is formed on the main body 552 of the abutting portion 55. When an upward force (as shown by an arrow) is exerted on the bottom end 551 of the abutting portion 55, the abutting surface 553 pushes the transitioning surface 543 of the engaging portion 54 inward, the resilience of the elastic element 40 is thus overcome, and the second end 542 of the engaging portion 54 moves inside the casing 20 along the direction shown by a horizontal arrow and disengages from the column 12 positioned outside the casing 20.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device assembly comprising:
   a cabinet comprising four columns substantially positioned at four corners of the cabinet, a window being defined between two front columns; and
   an electronic device accommodated in the cabinet, the electronic device comprising a casing, front and rear ends of the casing being secured to the cabinet, the casing comprising:
      a bottom plate defining an inserting opening therein;
      a lateral side defining an engaging opening therein; and
      an actuator movably connected to the casing and comprising an engaging portion and an abutting portion, the abutting portion extending through the inserting opening, and the engaging portion extending through the engaging opening and engaging with one of the columns, wherein when the abutting portion is pushed up, the actuator moves and the engaging portion disengages from the column;
   wherein the actuator further comprises a horizontal plate and a vertical plate extending upwardly from a lateral side of the horizontal plate, the abutting portion extending downwardly from a bottom surface of the horizontal plate, the engaging portion extending horizontally and outwardly from the vertical plate, a pair of pivot pins being formed on an opposite lateral side of the horizontal plate and pivotably secured on the bottom plate of the casing, an elastic element being mounted on one of the pivot pins, and the elastic element biasing the actuator in position in the casing such that the abutting portion extends through the inserting opening and the engaging portion extends through the engaging opening and is engaged with the one of the columns.

2. The electronic device assembly of claim 1, wherein the actuator further comprises a plurality of ribs formed between the horizontal plate and the vertical plate.

3. The electronic device assembly of claim 1, wherein two securing tabs are formed on the bottom plate, and the pivot pins of the actuator are pivotably secured to the securing tabs.

4. The electronic device assembly of claim 1, wherein a guiding surface is provided on a bottom end of the abutting portion, the guiding surface generally facing towards the window.

5. The electronic device assembly of claim 1, wherein two securing plates are formed on the front end of each casing for connecting to the two front columns, respectively.

6. The electronic device assembly of claim 1, wherein two securing mortises are defined in the rear end of the casing, and a plurality of tenons is formed on two rear columns for engaging in the securing mortises.

7. An electronic device assembly comprising:
   a cabinet defining a front window therein; and
   at least one electronic device accommodated in the cabinet, the at least one electronic device comprising a casing, front and rear ends of the casing being secured on the cabinet, the casing insertable into and withdrawable from the cabinet via the window, the casing comprising:
      a bottom plate defined an inserting opening therein;
      four lateral sides extending upwardly from the bottom plate, one of the lateral sides defining an engaging opening therein; and
      an actuator movably connected to the casing and comprising an engaging portion and an abutting portion, the abutting portion extending through the inserting opening, the engaging portion extending through the engaging opening and engaging with one of the columns, the abutting portion being pushable up to displace the actuator and disengage the engaging portion from the column;
   wherein an abutting surface is formed on a main body of the abutting portion, and a transitioning surface is formed on the engaging portion corresponding to the abutting surface; and
   wherein a first end of the engaging portion is elastically connected to the casing via an elastic element, and a second end of the engaging portion opposite to the first end extends through the engaging opening and engages with the one of the columns; and when the abutting portion is pushed up, the abutting portion abuts the transitioning surface and rides along the transitioning surface, the engaging portion is thereby driven in an inward direction, and the second end of the engaging portion moves inwardly in the casing to disengage from the one of the columns.

8. The electronic device assembly of claim 7, wherein a bottom end of the abutting portion extends through the inserting opening, and a diameter of the main body of the abutting portion is larger than that of the inserting opening.

9. An electronic device assembly comprising:
   a cabinet comprising four columns substantially positioned at four corners of the cabinet, a window being defined between two front columns; and
   a plurality of casings accommodated in the cabinet and stacked together, front and rear ends of the casings being secured to the cabinet, each casing comprising:
      a bottom plate defined an inserting opening therein;
      a lateral side defined an engaging opening therein; and an actuator movably connected to the casing and comprising an engaging portion and an abutting portion;

wherein the abutting portion of the actuator of a lower one of the casings extends through the inserting opening and is exposed outside of the lower casing, and the engaging portion of the actuator of the lower casing extends through the engaging opening and is engaged with one of the columns to block the lower casing from being withdrawn from the cabinet; and wherein the abutting portion of the actuator of an upper one of the casings immediately above the lower casing is pushed by the lower casing and thereby positioned inside the upper casing, and the actuator of the upper casing is thereby displaced such that the engaging portion of the actuator is positioned inside the upper casing and disengaged from the column.

10. The electronic device assembly of claim 9, wherein the abutting portion is separate from the engaging portion, an abutting surface is formed on a main body of the abutting portion, and a transitioning surface is formed on the engaging portion corresponding to the abutting surface.

11. The electronic device assembly of claim 9, wherein the actuator further comprises a horizontal plate and a vertical plate extending upwardly from a lateral side of the horizontal plate, the abutting portion extending downwardly from a bottom surface of the horizontal plate, the engaging portion extending horizontally and outwardly from the vertical plate, and a pair of pivot pins being formed on an opposite lateral side of the horizontal plate and pivotably secured on the bottom plate of the casing, an elastic element being mounted on one of the pivot pins, and the elastic element biasing the actuator in position in the casing such that the abutting portion extends through the inserting opening and the engaging portion extends through the engaging opening and is engaged with the one of the columns.

12. The electronic device assembly of claim 9, wherein a guiding surface is provided on a bottom end of the abutting portion, the guiding surface generally facing towards the window.

* * * * *